United States Patent
Rossetti

(10) Patent No.: US 6,809,417 B1
(45) Date of Patent: Oct. 26, 2004

(54) POWER CIRCUITRY WITH A THERMIONIC COOLING SYSTEM

(75) Inventor: Nazzareno Rossetti, Danville, CA (US)

(73) Assignee: Fairchild Semiconductor Corporation, South Portland, ME (US)

(*) Notice: Subject to any disclaimer, the term of this patent is extended or adjusted under 35 U.S.C. 154(b) by 0 days.

(21) Appl. No.: 10/408,471

(22) Filed: Apr. 7, 2003

(51) Int. Cl.$^7$ ............................................. H01L 23/10
(52) U.S. Cl. ........................ 257/707; 257/724; 257/691
(58) Field of Search ............................... 257/723, 724, 257/706, 707, 712, 713, 691

(56) References Cited

U.S. PATENT DOCUMENTS

| | | | | |
|---|---|---|---|---|
| 3,582,762 A | * | 6/1971 | Mori et al. ................ | 257/706 |
| 4,646,338 A | * | 2/1987 | Skillicorn ................. | 378/110 |
| 4,929,884 A | * | 5/1990 | Bird et al. ................. | 323/313 |
| 5,193,347 A | * | 3/1993 | Apisdorf ..................... | 62/3.7 |
| 6,089,311 A | | 7/2000 | Edelson | |
| 6,417,060 B2 | | 7/2002 | Tavkhelidze et al. | |
| 6,717,246 B2 | * | 4/2004 | Budelman ................. | 257/678 |
| 2003/0202330 A1 | * | 10/2003 | Lopata et al. .............. | 361/760 |

OTHER PUBLICATIONS

Avto Tavkhelidze et al., "Electron Tunneling Through Large Area Vacuum Gap—Preliminary Results," *ICT2002 Conference Proceedings*, 2002, pp. 1–4.

* cited by examiner

*Primary Examiner*—S. V. Clark
(74) *Attorney, Agent, or Firm*—Sidley Austin Brown & Wood LLP

(57) ABSTRACT

A power circuitry with a thermionic cooling system is provided. The system includes a voltage regulator and a heat rectifying device to cool the voltage regulator. The heat rectifying device includes a heat collector and a heat barrier, formed between the voltage regulator and the heat collector. An auxiliary voltage generator enables the electrons of the voltage regulator to tunnel onto the heat collector through the heat barrier. The voltage regulator may include a shared substrate and power transistors, generating a regulated voltage. In some embodiments the controller keeps a temperature in a preselected range by controlling the power transistors, the auxiliary voltage generator, and a fan. In some embodiments a load is integrated together with the thermionic cooling system so that the load itself can be cooled by the heat rectifying device.

33 Claims, 3 Drawing Sheets

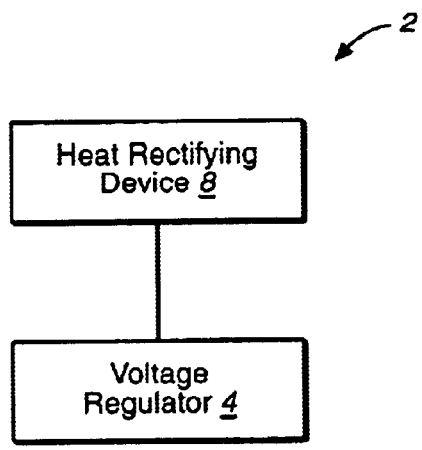
FIG._1
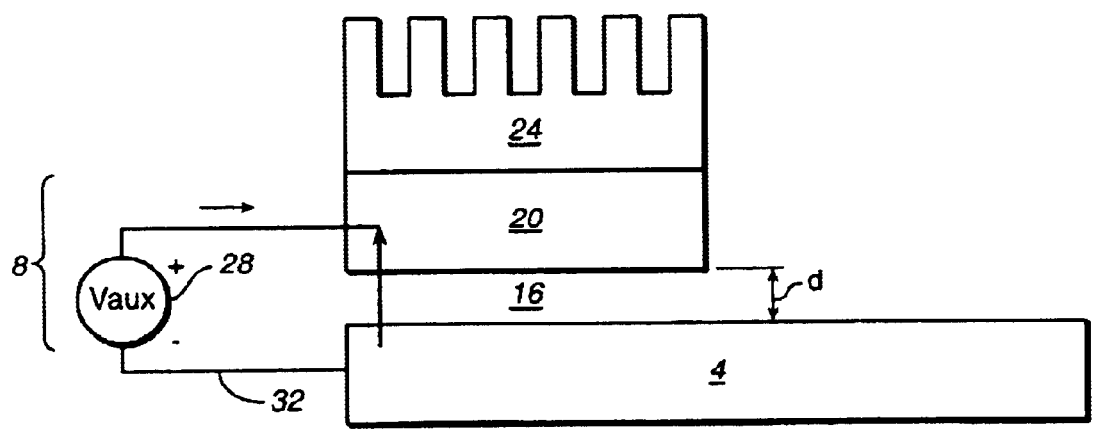
FIG._2

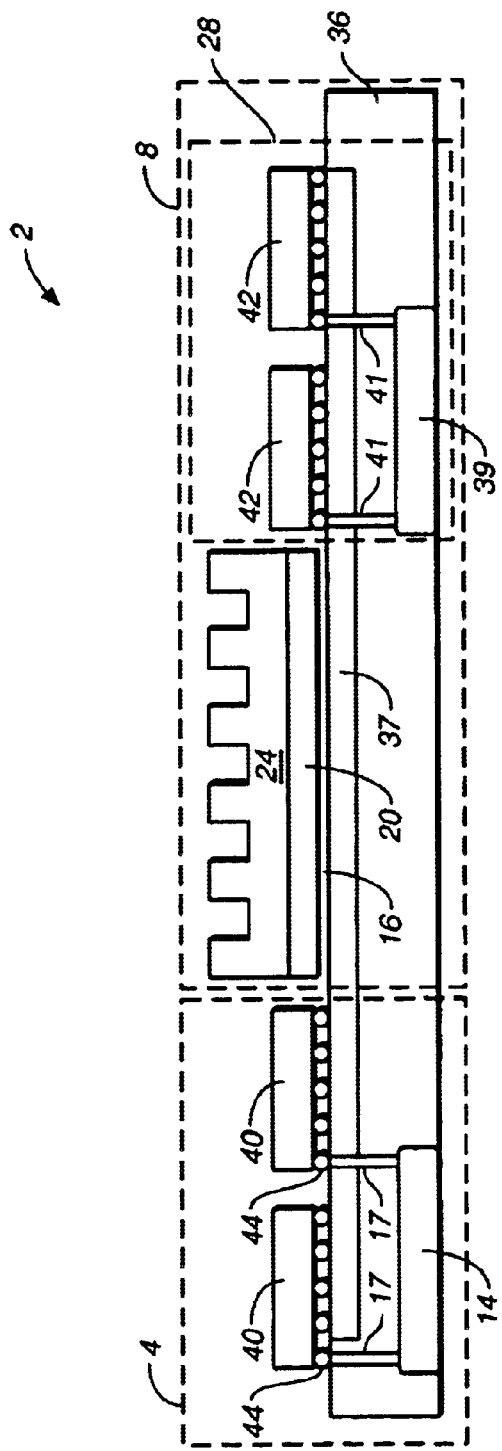
FIG._3
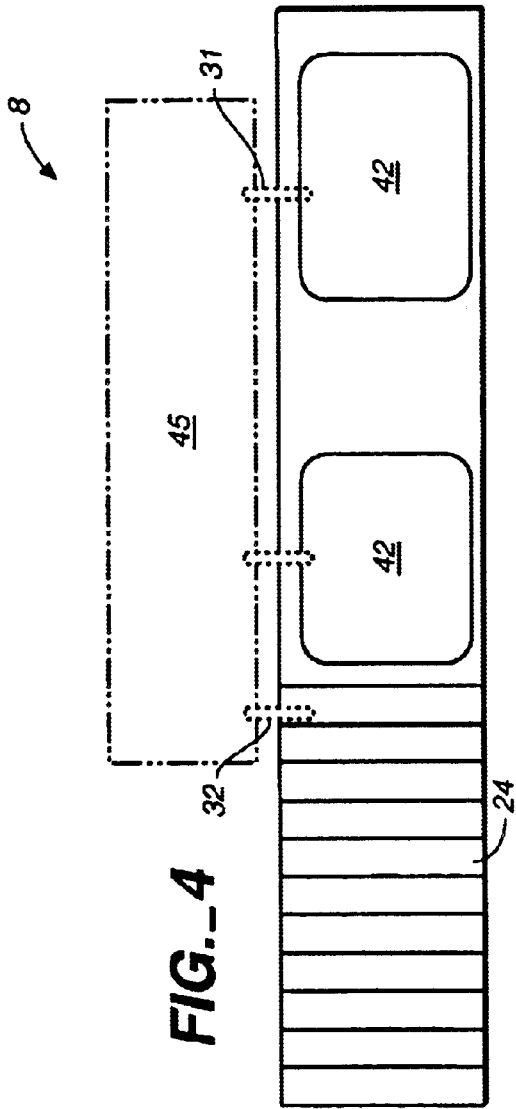
FIG._4

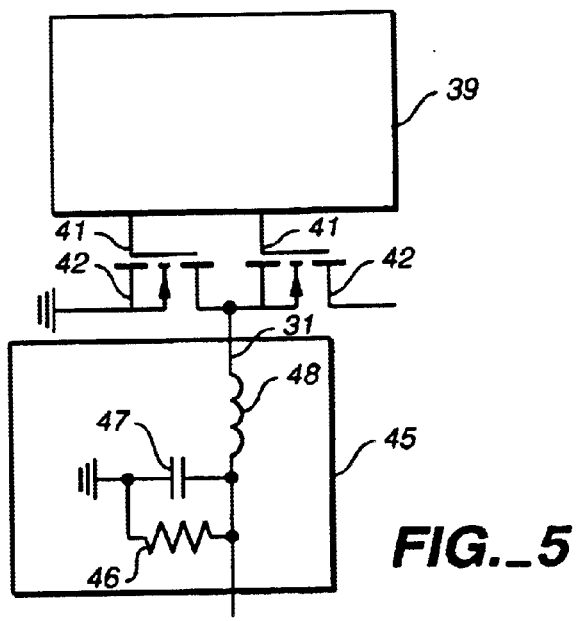
FIG._5
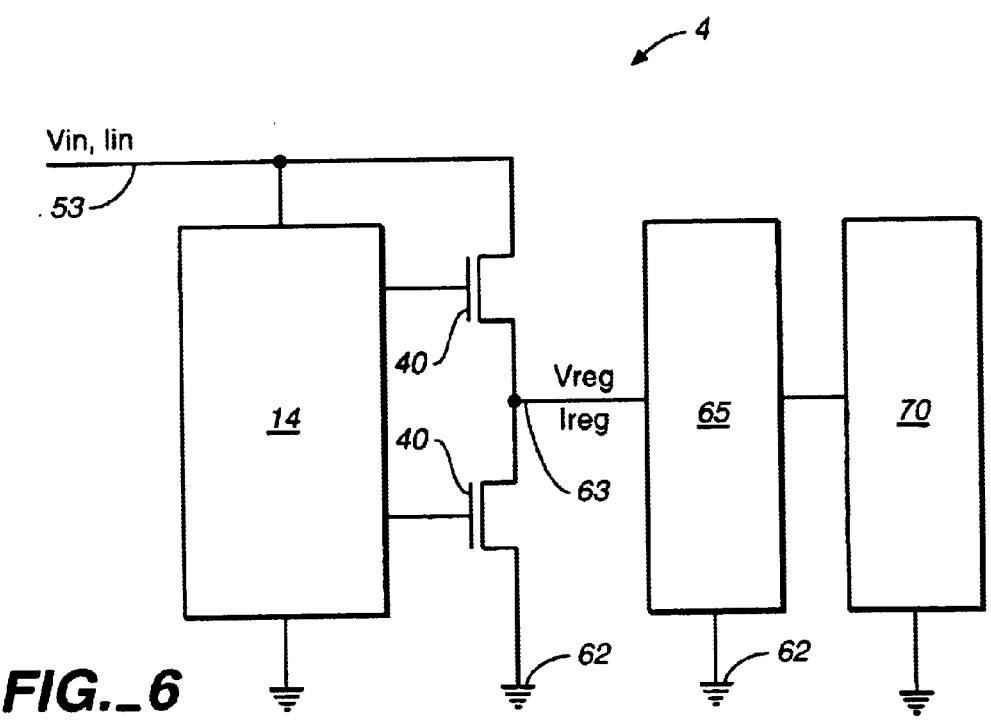
FIG._6

POWER CIRCUITRY WITH A THERMIONIC COOLING SYSTEM

BACKGROUND

1. Field of Invention

The present invention relates to cooling systems of power circuitry, and more particularly to the thermionic cooling of voltage regulator and/or loads.

2. Description of Related Art

In electronic circuits the flow of current is inseparably accompanied by the production of heat by the resistive circuit elements. In modem electronic circuitry the feature size is ever decreasing. Correspondingly, the current densities and resistances are increasing, leading to a rapid increase of the produced heat. The increased amount of heat needs to be removed from the circuitry for sustainable operations.

Cooling systems can be based on circulating coolant fluids by a compressor through a system of valves and pipelines. Much of today's refrigeration technology is based on this design. However, using fluids, valves, motors and other moveable parts in electronic circuits requires the integration of rather incompatible technologies. Therefore, other cooling systems are sought.

Electronic cooling systems can be categorized as passive and active systems. Passive systems typically couple the heat source (the electronic circuitry) to a heat sink. Sometimes the heat source is referred to as cold plate, and the heat sink as hot plate. In these systems the heat is conducted from the hotter source to the colder sink driven by the temperature, or thermal, gradient, according to basic laws of thermodynamics. In some systems the heat sink is in direct contact with the environment, exchanging the excess heat by heat conduction and heat convection. In other systems the heat sink is cooled by a fan or by analogous methods. For example in many of today's computers, microprocessors are cooled with a fan.

However, in these systems the rate of heat transfer is typically slow. Furthermore, passive systems are incapable of transferring heat from a colder place to a hotter one. Therefore, the source always remains hotter than the sink.

Active systems employ an active heat pump or an equivalent of it, which enhances the heat transfer from the source to the sink. Therefore, the flow of heat is faster than in passive systems, in which heat is transferred solely by thermal gradients. Moreover, these active systems can operate to transfer heat from a colder source to a warmer sink.

In some active systems the heat pump drives the "hot" electrons of the source to a remote area of the circuit, which acts as a heat sink. While heat is transferred away from the heat source by driving away hot electrons, often the atoms and even some of the electrons of the host material conduct the heat back to the source area. This back-flow poses a strong limitation on the efficiency of these systems.

SUMMARY

Briefly and generally, embodiments of the invention include a power circuitry with a thermionic cooling system. Some embodiments include a voltage regulator and a heat rectifying device, operable to cool the voltage regulator. Some embodiments of the heat rectifying device include a heat collector and a heat barrier, formed between the voltage regulator and the heat collector, wherein electrons from the voltage regulator are enabled to tunnel across the heat barrier onto the heat collector by an auxiliary voltage.

In some embodiments the heat rectifying device includes a heat collector and a heat barrier, formed between the voltage regulator and the heat collector. The heat barrier prevents the back-flow of heat from the heat collector to the voltage regulator. An auxiliary voltage generator applies an auxiliary voltage between the voltage regulator and the heat collector, enabling the hot electrons of the voltage regulator to tunnel onto the heat collector through the heat barrier. Some embodiments also include a heat sink, coupled to the heat collector and a fan to cool the heat sink. Some embodiments include a controller, controlling the voltage regulator and the heat rectifying device.

In some embodiments the voltage regulator includes a voltage controller and one or more power transistors. The power circuitry can be positioned on a shared substrate, which is shared by the voltage controller and the power transistors. In some embodiments the voltage controller keeps a temperature of at least one of the power transistors, the heat collector, the heat sink, and the shared substrate in a preselected range by controlling at least one of the power transistors, the auxiliary voltage generator, and a fan, positioned to cool the heat sink.

In some embodiments a load is integrated together with the cooling system so that the load itself can be cooled by the heat rectifying device. In some embodiments the voltage regulator is capable of operating at a power density of more than 5,000 W/cm$^2$.

BRIEF DESCRIPTION OF DRAWINGS

For a more complete understanding of the present invention and for further features and advantages, reference is now made to the following description taken in conjunction with the accompanying drawings.

FIG. 1 is a block diagram of a thermionically cooled voltage regulator, according to an embodiment of the invention.

FIG. 2 is an exemplary implementation of a heat rectifying device in combination with a voltage regulator, according to an embodiment of the invention.

FIG. 3 is an exemplary implementation of a thermionically cooled voltage regulator, according to an embodiment of the invention.

FIG. 4 is an exemplary implementation of a passive circuit coupled to a heat rectifying device, according to an embodiment of the invention.

FIG. 5 is a low pass filter, illustrating an exemplary implementation of a passive circuit, according to an embodiment of the invention.

FIG. 6 illustrates a thermionic cooling system, with an integrated load according to embodiments of the invention.

DETAILED DESCRIPTION

Embodiments of the present invention and their advantages are best understood by referring to FIGS. 1–6 of the drawings. Like numerals are used for like and corresponding parts of the various drawings.

FIG. 1 is a block diagram of a system 2 for thermionically cooling a voltage regulator, according to an embodiment of the invention. In system 2, a voltage regulator 4 is coupled to a heat rectifying device 8. Each of these elements may contain several components.

FIG. 2 illustrates an exemplary implementation of heat rectifying device 8 in combination with voltage regulator 4, according to an embodiment of the invention. When voltage regulator 4 is operated, it generates heat, i.e. it becomes a heat source. As depicted, heat rectifying device 8 includes a heat barrier 16 and a heat collector 20. Heat barrier 16 can be a vacuum gap, or can be formed from a material with low heat conductivity. Heat collector 20 can be formed by any lithographic technologies. In some embodiments, heat collector 20 is formed from metals with good heat conductivity, such as copper. In other embodiments a wide class of metallic or other layers can be applied which have good heat conductivity. Heat barrier 16 separates voltage regulator 4 from heat collector 20 by a distance d, which can be in the range of about 1 nm to about 30 nm in some embodiments. The value of d is chosen, among other things, depending on the work function of the materials involved. This distance is very small and requires great control during manufacture.

According to one technique, a vacuum gap can be formed by a special lift-off technology. Initially in this "thermionic" technique a double layer structure is formed. The two layers are bound only by a low adhesion and have different heat expansion coefficients. Therefore, when a suitable heat treatment is performed, the two layers peel away from each other. This exposes the inner surfaces of the layers facing each other, separated by the vacuum gap between them. Since they were overlaying each other before the peeling-off, the exposed surfaces track each other's irregularities, and hence their distance d is approximately constant throughout the layers. Details of this technique are described in U.S. Pat. No.: 6,089,311 to J. Edelson, and in U.S. Pat. No.: 6,417,060 B2, to A. Tavkhelidze, incorporated herein by reference in their entirety.

One of the layers of the double layer structure is coupled to voltage regulator 4, which acts as the heat source. The other layer is coupled to heat collector 20. The thermionic cooling system works by extracting hot electrons from the heat source such as voltage regulator 4 and making them tunnel across heat barrier 16 to heat collector 20.

An auxiliary voltage generator 28 is coupled between voltage regulator 4 and heat collector 20, which is capable of applying an auxiliary voltage $V_{aux}$ between voltage regulator 4 and heat collector 20. In the absence of an auxiliary voltage $V_{aux}$, the vacuum gap is a sufficiently big potential barrier so that electrons cannot tunnel through it in either direction, making the vacuum gap a very efficient heat insulator or barrier. When a sufficiently big auxiliary voltage $V_{aux}$ is applied between voltage regulator 4 and heat collector 20 by an auxiliary voltage generator 28, the potential difference allows the hot electrons of voltage regulator 4 to tunnel through heat barrier 16 onto heat collector 20, as indicated by the arrow from voltage regulator 4 to heat collector 20. This flow of electrons completes the circuit and current flows through auxiliary links 32 back to auxiliary voltage generator 28, as indicated.

During the described operation of the thermionic cooling system, heat is not conducted back from the heat sink onto the source through heat barrier 16, because of the polarity of the auxiliary voltage does not allow the electrons to tunnel back. Further, the atoms of heat collector 20 cannot tunnel through heat barrier 16 either. These features make heat barrier 16 a very efficient heat insulator. Also, as the backflow of heat is essentially eliminated during the heat transfer, device 8 is indeed a heat rectifier device.

Once the hot electrons tunneled through heat barrier 16 they release their energy to the colder electrons and atoms of heat collector 20. This heat is then conducted and transferred to a heat sink 24. In some embodiments heat sink 24 is formed of a metal with good heat conductivity. Also, heat sink 24 can be formed with a ribbed structure to provide a large surface so the heat exchange with the ambient environment can take place efficiently. In some embodiments, additional cooling of the heat sink can be performed, for example by a fan. It is possible to couple the heat sink to any known cooling system, including cooling systems, which circulate cooling liquids.

The efficiency of heat rectifying device 8 can be calculated from thermodynamical considerations and compared to other cooling technologies. The technologies will be compared at the following setup: 1 Watt of energy is transferred from voltage regulator 4 at room temperature ($T_{source}$=300 K) to heat collector 20 ($T_{collector}$=573 K). In this section voltage regulator 4 will be referred to as heat source 4.

According to the laws of thermodynamics, the ideal, or Carnot efficiency of this process is 52%. Simple calculation shows that in this ideal case 0.92 Watts are required to transfer 1 W from heat source 4 to heat collector 20.

Technologies that use state of the art compressor and fluid circulator systems can reach 45% of the Carnot efficiency of 52%. In other words, 2.05 Watts are required to transfer 1 W from the source to the sink with these state of the art systems. This result translates to a total power supply efficiency of 33%. Here the total power supply efficiency is defined as η=(energy removed)/(energy removed+work required). However, as mentioned, these systems use fluids, compressors, valves, and moving parts, which makes it difficult to integrate them with electronic circuit manufacturing technologies.

Some all-electronic cooling systems are based on the Peltier effect. However, the Peltier-based cooling systems presently operate at 5% of the efficiency of the Carnot cycle. Therefore, systems which utilize the Peltier effect require 18.4 Watts to transfer 1 Watt from heat source 4 to heat collector 20. This translates to a η=5% power supply efficiency. This low efficiency value means that in present systems only chips, which produce at most a 100 W/cm$^2$ power density can be properly cooled.

With the thermionic cooling technology, according to one embodiment of the invention, 70% of the Carnot efficiency can be achieved. In other words, only 1.32 Watts are required to transfer 1 Watt of power. This translates to a power supply efficiency of η) =43%. Therefore, the efficiency of the thermionic cooling technology is considerably superior to the presently used cooling technologies. Furthermore, thermionic cooling systems can be manufactured by easy-to-integrate lithographic technologies. For all these reasons, it is expected that the thermionic cooling systems in accordance with embodiments of the invention can adequately cool chips, which generate a power density in the range of about 1,000 W/cm$^2$ to about 5,000 W/Cm$^2$.

Furthermore, since this thermionic cooling system is an active cooling system, heat source 4 can be cooler than heat collector 20. In some embodiments, the heat source, such as voltage regulator 4, can be about 10° C. above the ambient temperature, whereas heat collector 20 and heat sink 24 can be in the range of about 80° C. to about 300° C. in an ambient temperature of 30° C.

FIG. 3 illustrates an exemplary implementation of a thermionically cooled voltage regulator, according to an embodiment of the invention. Voltage regulator 4 and heat rectifying device 8 are formed on a shared substrate 36. Shared substrate 36 may be a semiconductor material, for example, a silicone die, wafer, or other monolithic structure. Shared substrate 36 can also include other microelectronic and mechanic systems, or MEMS. A vast variety of MEMS are known to those in the art, including micro-mechanical motors, sensors, actuators, and electronic circuitry.

Voltage regulator 4 includes a voltage controller 14 and power transistors 40. In some embodiments voltage controller 14 and power transistors 40 are formed on the same side of shared substrate 36. In the shown embodiment voltage controller 14 and power transistors 40 are formed on opposing sides of shared substrate 36.

Voltage controller 14 can be an integrated circuit. In embodiments where voltage controller 14 and power transistors 40 are on opposing sides of shared substrate 36, the electrical connection between voltage controller 14 and power transistors 40 can include vias 17. Vias 17 are through-holes formed across shared substrate 36. Vias 17 may be coupled to leads formed on the opposing sides of shared substrate 36. Voltage controller 14 and power transistors 40 may be coupled either directly to vias 17 or to the leads.

In other embodiments voltage controller 14 is formed on the same side of shared substrate 36 as the power transistors. These embodiments may not contain vias for electrical connections, but may include leads formed on shared substrate 36.

Power transistors 40 can be coupled to vias 17 or the leads through a ball bond array 44, or a solder ball array. Power transistors 40 are formed separately, i.e. are "discrete," because power transistors 40 are handling large currents and voltages. Therefore, power transistors 40 require efficient cooling. Further, they are formed by techniques different from that of low power integrated circuitry. The transistors of voltage controller 14 are operated with smaller currents or voltages and therefore can be formed in shared substrate 36.

In some embodiments power transistors 40 are discrete double diffusion MOS (DMOS) transistors, suited to handle high voltages and large currents. In some embodiments the currents handled by power transistors 40 are in the range of about 0.1 amperes to about 100 Amperes. In some embodiments, power transistors 40 can be formed as or implemented in MOS, JFET, NPN, PNP, PMOS, or NMOS transistors. Power transistors 40 can have a flip-chip architecture. In some embodiments, voltage controller 14 and power transistors 40 can be integrated.

In some embodiments, heat rectifying device 8 is formed in proximity to power transistors 40. Heat rectifying device 8 includes auxiliary voltage source 28, heat barrier 16, heat collector 20, and heat sink 24. Heal barrier 16 is formed between shared substrate 36 and heat collector 20. Heat collector 20 is formed to conduct heat to heat sink 24 efficiently.

A heat conductor plate 37 can be formed in shared substrate 36. Heat conductor plate 37 lies partially under power transistors 40, but also extends to a region not covered by power transistors 40. The heat generated by power transistors 40 heats the electrons of heat conductor plate 37 in the region underneath power transistors 40. These hot electrons are then driven by the auxiliary voltage of auxiliary voltage generator 28 from underneath power transistors 40 to the region not covered by power transistors 40.

The hot electrons in the uncovered region of heat conductor plate 37 are driven by the auxiliary voltage of auxiliary voltage generator 28 through heat barrier 16 onto heat collector 20, via tunneling. In heat collector 20 these hot electrons release their thermal energy to the other electrons and atoms. From heat collector 20 the heat is transferred to heat sink 24. The heat is transferred from heat sink 24 to the ambient environment. The coupling between auxiliary voltage generator 28 and heat collector 20 will be shown in FIG. 4.

In some embodiments heat rectifying device 8 may be formed in direct contact with power transistors 40.

Auxiliary voltage generator 28 includes auxiliary voltage controller 39 and auxiliary power transistors 42. In the shown embodiment auxiliary voltage controller 39 is formed on the side of shared substrate 36 opposing auxiliary power transistors 42, as shown in FIG. 3. In these embodiments vias 41 can be formed to electrically couple auxiliary voltage controller 39 to auxiliary power transistors 42. In some embodiments auxiliary leads 32 (not shown) can be formed on one or both sides of shared substrate 36, providing electrical contact between vias 41 and auxiliary power transistors 42 and auxiliary voltage controller 39.

In some embodiments auxiliary power transistors 42 and power transistors 40 are chosen such that during the operation of thermionically cooled voltage regulator 2 their temperature is close to each other's.

In other embodiments auxiliary voltage controller 39 can be formed on the same side of shared substrate 36 as auxiliary power transistors 42. In these embodiments auxiliary leads 32 (not shown) can be formed to electrically couple auxiliary voltage controller 39 to auxiliary power transistors 42.

In the embodiment of FIG. 3 auxiliary voltage controller 39 can be adapted to keep a preselected part of the cooling system's circuitry within a preselected temperature range. This preselected part can be, for example, power transistors 40. Auxiliary voltage controller 39 can keep the temperature of the preselected part in the preselected temperature range by controlling, for example, the auxiliary voltage $V_{aux}$ generated by auxiliary voltage generator 28. In some embodiments, heat sink 24 is additionally cooled by a fan. In these embodiments auxiliary voltage controller 39 may also control the fan.

In some embodiments auxiliary voltage controller 39 may include or work in conjunction with thermal sensors coupled to parts of the circuitry. These sensors provide signals to auxiliary voltage controller 39 in response to the sensed temperature. In response to the signals of the sensors, auxiliary voltage controller 39 may initiate a control action.

For example, if a sensor senses that the temperature of power transistors 40 rises above a predetermined temperature, the sensor sends a signal to auxiliary voltage controller 39. In response, auxiliary voltage controller 39 can either increase the auxiliary voltage $V_{aux}$ to drive more hot electrons from heat conductor plate 37 through heat barrier 16 to heat collector 20, or it can increase the speed of the fan, which cools heat sink 24, or it can lower the driving voltage of power transistors 40, or it can initiate any combination of the above control actions. In other embodiments auxiliary voltage controller 39 performs one or more of the above control actions according to the voltage delivered to a load by voltage regulator 4. In some embodiments, the control functions of auxiliary voltage controller 39 can be performed by a separate controller.

FIG. 4 illustrates heat rectifying device 8 viewed from above the plane of shared substrate 36. Auxiliary power transistors 42 are coupled to passive circuitry 45 through links 31. In some embodiments passive circuitry 45 includes low pass filters. An exemplary implementation of a low pass filter is illustrated in FIG. 5. Passive circuitry 45 can be coupled through auxiliary link 32 to heat collector 20, located under the shown heat sink 24. Auxiliary power generator 28 provides auxiliary voltage $V_{aux}$ between heat collector 20 and heat conductor plate 37, thus completing the circuit for the hot electrons.

FIG. 5 illustrates a low pass filter as an exemplary implementation of passive circuitry 45. Passive circuitry 45 is coupled to auxiliary power transistors 42 through link 31. Auxiliary power transistors 42 are coupled through vias 41 to auxiliary voltage controller 39. The low pass filter can include, for example, resistor 46, capacitor 47, and inductor 48 in any one of the many layouts for low pass filters, well known in the art.

FIG. 6 illustrates a circuit diagram for voltage regulator 4 coupled to a load, according to an embodiment of the invention. Voltage regulator 4 and power transistors 40 are coupled to input rail 53. The input voltage $V_{in}$ of input rail 53 can be in the range of about 5V to about 20V, for example 12V. The input current $I_{in}$ of input rail 53 can be in the range of about 1 A to about 30 A, for example, 10 A. The input voltage $V_{in}$ may drive both voltage controller 14 and power transistors 40. In some embodiments, there are two power transistors 40 coupled in series between input rail 53 and a ground 62. Other embodiments can employ only one or more than two power transistors. The regulated voltage $V_{reg}$ is coupled out at output terminal 63 between power transistors 40. Voltage controller 14 controls power transistors 40 in order to keep the regulated voltage $V_{reg}$ within a predetermined range. In some embodiments the regulated voltage $V_{reg}$ is between about 0.5V and about 5V, for example, 1.1V. The regulated current $I_{reg}$ can be between 10 A and 200 A, for example 100 A. The regulated voltage $V_{reg}$ can be received by a filter 65. Filter 65 can be, for example, a low pass filter. The output of filter 65 is then coupled to a load 70.

Load 70 can be any of a variety of electronic circuitry, including, but not restricted to, power amplifiers, CPUs, satellite receivers, and low noise amplifiers. As mentioned before, with advances in miniaturization, all of these circuits require increasingly efficient cooling.

In some embodiments, amplifiers can be included in the circuitry as needed, for example between voltage controller 14 and power transistors 40.

In some embodiments load 70 is formed on shared substrate 36 as well. Load 70 can be formed on the same side as power transistors 40, or on the side opposing power transistors 40. In these embodiments heat rectifying device 8 can also cool load 70. For example, heat conductor plate 37 can extend to load 70, so that a thermal coupling is established between load 70 and heat conductor plate 37. During the operation of this embodiment hot load 70 is creating hot electrons in heat conductor plate 37, which are then driven through heat barrier 16 to heat collector 20 by the auxiliary voltage $V_{aux}$.

Auxiliary voltage controller 39 can be adapted to keep a preselected part of the cooling system's circuitry within a preselected temperature range. This preselected part can be, for example, power transistors 40 or load 70. Auxiliary voltage controller 39 can keep the temperature of the preselected part in the preselected temperature range by controlling, for example, the auxiliary voltage $V_{aux}$ generated by auxiliary voltage generator 28. In some embodiments, heat sink 24 is additionally cooled by a fan. In these embodiments auxiliary voltage controller 39 may also control the fan.

In some embodiments auxiliary voltage controller 39 may include or work in conjunction with thermal sensors coupled to parts of the circuitry. These sensors provide signals to auxiliary voltage controller 39 in response to the sensed temperature. In response to the signals of the sensors, auxiliary voltage controller 39 may initiate a control action.

For example, if a sensor senses that the temperature of power transistors 40 or of load 70 rises above a predetermined temperature, the sensor sends a signal to auxiliary voltage controller 39. In response, auxiliary voltage controller 39 can increase the auxiliary voltage $V_{aux}$ to drive more hot electrons from heat conductor plate 37 through heat barrier 16 to heat collector 20. Alternatively, auxiliary voltage controller 39 can increase the speed of the fan, which cools heat sink 24. Finally, auxiliary voltage controller 39 can lower the driving voltage $V_{in}$ of power transistors 40 and therefore the regulated voltage $V_{reg}$ received by load 70. Auxiliary voltage controller 39 can also initiate any combination of the above control actions. In other embodiments auxiliary voltage controller 39 performs one or more of the above control actions according to the regulated voltage $V_{reg}$ delivered to load 70.

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. A power circuitry with a thermionic cooling system, comprising:

a voltage regulator; and a heat rectifying device operable to cool the voltage regulator, the heat rectifying device comprising:

a heat collector; and a heat barrier, positioned between the voltage regulator and the heat collector, wherein electrons can be enabled to tunnel from the voltage regulator across the heat barrier onto the heat collector by a voltage applied between the voltage regulator and the heat collector.

2. The power circuitry of claim 1, wherein the heat barrier comprises at least one of a vacuum gap and a layer with low heat conductance.

3. The power circuitry of claim 1, wherein the heat barrier is operable to prevent a back-flow of heat from the heat collector to the voltage regulator.

4. The power circuitry of claim 1, comprising a voltage generator, operable to apply a voltage between the voltage regulator and the heat collector, enabling the electrons to tunnel from the voltage regulator across the heat barrier onto the heat collector.

5. The power circuitry of claim 1, comprising a heat sink, coupled to the heat collector.

6. The power circuitry of claim 5, wherein:

the heat sink comprises a ribbed metal structure; and the heat collector comprises a metal layer.

7. The power circuitry of claim 5, comprising
a fan, operable to cool the heat sink.

8. The power circuitry of claim 1, wherein
the power supply efficiency of the thermionic cooling system is close to the Carnot efficiency.

9. The power circuitry of claim 1, wherein the voltage regulator comprises
a voltage controller; and
at least one power transistor, wherein
the voltage controller is operable to control the voltage of the at least one power transistor.

10. The power circuitry of claim 9, wherein the at least one power transistor comprises
at least one of a MOS, DMOS, PMOS, NMOS, JFET, NPN, and PNP transistor.

11. The power circuitry of claim 9, comprising
a heat conductor plate, thermally coupled to the at least one power transistor and
to the heat rectifying device.

12. The power circuitry of claim 9, comprising
a shared substrate, shared by the voltage controller and the at least one power transistor.

13. The power circuitry of claim 12, wherein
the voltage controller and the at least one power transistor are disposed on opposing sides of the shared substrate.

14. The power circuitry of claim 13, wherein
the voltage controller is coupled to the at least one power transistor by vias.

15. The power circuitry of claim 12, wherein
the voltage controller and the at least one power transistor are disposed on the same side of the shared substrate.

16. The power circuitry of claim 12, wherein
the heat rectifying device is formed on the shared substrate.

17. The power circuitry of claim 16, wherein the heat rectifying device comprises
an auxiliary voltage generator, operable to provide a voltage across the heat barrier.

18. The power circuitry of claim 17, wherein the auxiliary voltage generator comprises:
an auxiliary voltage controller; and
at least one auxiliary power transistor.

19. The power circuitry of claim 18, wherein
the auxiliary voltage controller and the at least one auxiliary power transistor are formed on opposing sides of the shared substrate, and are coupled through vias.

20. The power circuitry of claim 17, further comprising
a heat conductor plate, thermally coupled to the voltage regulator and to the auxiliary voltage generator.

21. The power circuitry of claim 17, wherein
the auxiliary voltage generator is coupled to the heat collector through a passive circuit.

22. The power circuitry of claim 21, wherein
the passive circuit is a low pass filter.

23. The power circuitry of claim 17, wherein
the auxiliary voltage generator operates to keep a temperature of at least one of the heat collector, the heat sink, the at least one power transistor, the auxiliary voltage generator, and the shared substrate in a preselected range.

24. The power circuitry of claim 23, wherein
the controller keeps a temperature of at least one of the heat collector, the heat sink, the at least one power transistor, the auxiliary voltage generator, and the shared substrate in a preselected range by controlling at least one of the power transistors, the voltage generator, and a fan, positioned to cool the heat sink.

25. The power circuitry of claim 9, wherein the at least one power transistor comprises two discrete power transistors, coupled in series between an input rail and a ground and controlled by the voltage controller.

26. The power circuitry of claim 25, wherein the voltage regulator comprises an output terminal, positioned between the two discrete power transistors, operable to provide a regulated voltage.

27. The power circuitry of claim 1, further comprising
a load, integrated together with the power circuitry.

28. The power circuitry of claim 27, wherein
the load is one of a power amplifier, a CPU, a satellite receiver, and a low noise amplifier.

29. The power circuitry of claim 27, wherein
the thermionic cooling system is operable to cool the load.

30. The power circuitry of claim 29, wherein
the thermionic cooling system keeps a temperature in a preselected range by controlling a voltage applied to the load.

31. A power circuitry with a thermionic cooling system, comprising:
a voltage regulator means; and
a heat rectifying means operable to cool the voltage regulator means, the heat rectifying means comprising:
a heat collector means; and
a heat barrier means, positioned between the voltage regulator means and the heat collector means, wherein
electrons can be enabled to tunnel from the voltage regulator means across the heat barrier means onto the heat collector means by a voltage applied between the voltage regulator and the heat collector.

32. A method of thermionic cooling of a power circuitry, the method comprising:
providing a voltage regulator; and
providing a heat rectifying device operable to cool the voltage regulator, the heat rectifying device comprising:
a heat collector; and
a heat barrier, positioned between the voltage regulator and the heat collector, wherein
electrons can be enabled to tunnel from the voltage regulator across the heat barrier onto the heat collector by a voltage applied between the voltage regulator and the heat collector.

33. The thermionic cooling method of claim 32, the method comprising
applying a voltage between the voltage regulator and the heat collector to enable electrons to tunnel from the voltage regulator across the heat barrier onto the heat collector.

* * * * *